United States Patent
Lee

(10) Patent No.: US 7,308,238 B2
(45) Date of Patent: Dec. 11, 2007

(54) AUTOMATIC FREQUENCY CONTROLLING APPARATUS AND METHOD OF MOBILE COMMUNICATION TERMINAL

(75) Inventor: Jae Cheol Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 385 days.

(21) Appl. No.: 10/873,265

(22) Filed: Jun. 23, 2004

(65) Prior Publication Data
US 2004/0266377 A1    Dec. 30, 2004

(30) Foreign Application Priority Data
Jun. 24, 2003    (KR) .................... 10-2003-0041272

(51) Int. Cl.
*H04B 1/18*    (2006.01)
(52) U.S. Cl. ............................... 455/192.2; 455/182.2; 455/136; 455/164.1
(58) Field of Classification Search ........... 455/164.1, 455/182.2, 133, 192.1, 192.2, 136, 196.1, 455/255, 256, 257, 502, 334; 375/344; 370/500, 503
See application file for complete search history.

(56) References Cited

U.S. PATENT DOCUMENTS

| | | | | |
|---|---|---|---|---|
| 3,495,242 A | * | 2/1970 | Dickey, Jr. ............... | 455/164.1 |
| 3,512,089 A | * | 5/1970 | Cushman .................... | 455/256 |
| 3,611,152 A | * | 10/1971 | Sakai et al. .................. | 455/334 |
| 4,176,351 A | * | 11/1979 | DeVita et al. ............ | 455/192.1 |
| 4,580,101 A | * | 4/1986 | Lax ............................. | 455/502 |
| 4,939,789 A | * | 7/1990 | Sakashita et al. ......... | 455/196.1 |
| 5,668,829 A | * | 9/1997 | Saito ........................... | 375/344 |
| 5,684,836 A | | 11/1997 | Nagayasu et al. | |
| 6,181,923 B1 | | 1/2001 | Kawano et al. | |
| 6,359,938 B1 | * | 3/2002 | Keevill et al. .............. | 375/344 |
| 6,385,232 B1 | * | 5/2002 | Terashima ................... | 375/344 |
| 6,560,303 B1 | | 5/2003 | Fan et al. | |
| 6,571,088 B1 | * | 5/2003 | Hasegawa ................ | 455/182.2 |
| 7,013,135 B2 | * | 3/2006 | Hiramatsu ................... | 455/423 |
| 2004/0043746 A1 | * | 3/2004 | Hiramatsu ................... | 455/334 |

FOREIGN PATENT DOCUMENTS

| | | |
|---|---|---|
| EP | 0689313 A | 12/1995 |
| JP | 07-321762 | 12/1995 |

(Continued)

OTHER PUBLICATIONS

European Search Report dated Oct. 12, 2004.

(Continued)

*Primary Examiner*—Lana Le
(74) *Attorney, Agent, or Firm*—Ked & Associates, LLP

(57) ABSTRACT

An apparatus and method for performing automatic frequency control of a mobile communication terminal detects a current peak position value from a downlink pilot signal and then calculates a difference value (dev) between the current peak position and a previous peak position value. A zero-run value is then calculated by counting the number of successive 0s in the difference value (dev), and an AFC voltage from controlling an oscillator is obtained based on the difference value. This difference value is then used to control a frequency of a transmitter in the terminal. Accordingly, an accurate oscillation frequency can be generated without being affected by noise existing in the communication environment and thus communication performance can be enhanced.

16 Claims, 2 Drawing Sheets

| | FOREIGN PATENT DOCUMENTS | | | WO | 03/030400 A1 | 9/2002 |
|----|----|----|----|----|----|----|
| JP | 09-219692 | | 8/1997 | | OTHER PUBLICATIONS | |
| JP | 2000174662 A | * | 6/2000 | | | |
| JP | 2000-278254 | | 10/2000 | Japanese Office Action dated Jun. 21, 2006. | | |
| JP | 2002-252665 | | 9/2002 | | | |
| KR | 2002-0057822 | | 7/2002 | * cited by examiner | | |

AUTOMATIC FREQUENCY CONTROLLING APPARATUS AND METHOD OF MOBILE COMMUNICATION TERMINAL

BACKGROUND OF THE INVENTION

1. Field of the Invention

The present invention generally relates to mobile communication systems, and more particularly to a system and method for performing automatic frequency control in a mobile communication terminal.

2. Background of the Related Art

In a mobile communication system, frequencies must be adjusted to be the same between comnunication-connected objects. This is especially true in cellular communication systems where terminals operate in synchronization with a base station. In a CDMA (Code Division Multiple Access) system, for example, signals are spread using a specific spread code and then transmitted. At the receiver side, the signals are reverse spread and demodulated to their original states.

In communicating signals in this manner, phase synchronization is performed between the spread codes of a transmitting side and receiving side. Without this phase synchronization, the original signal cannot be demodulated. In synchronizing the frequency of the mobile terminal to that of the base station, an automatic frequency controlling (AFC) is performed.

A related-art automatic frequency controller includes a frequency displacement detector and a crystal oscillator, which has capability of performing fine controlling based on an analog voltage. The frequency displacement detector extracts a sinusoidal signal component from a demodulated signal, measures the tilt of its phase, and then calculates a frequency difference between the transmitting side and receiving side based on the tilt. The crystal oscillator is controlled based on the calculated frequency difference, and a phase of a signal received afterwards is adjusted to be close to a horizon.

In mobile communication systems of the aforementioned type, frequencies are corrected according to fine changes in the transmitting side, various paging environments and movements of the receiving side. As these effects vary, the frequency displacement detector must keep pace.

The related-art method for detecting frequency displacement has a number of drawbacks. For example, because frequencies are affected by noise generated during transmission and from the periphery of the mobile communication terminal, it is difficult to detect an accurate frequency correction value, and also additional controlling is required to minimize the influence of noise. This complicates the process of performing frequency control and therefore makes the related-art method undesirable.

SUMMARY OF THE INVENTION

An object of the invention is to solve at least the above problems and/or disadvantages and to provide at least the advantages described hereinafter.

Another object of the present invention is to provide an apparatus and method for automatically controlling a frequency of a mobile communication terminal based on a pilot signal radiated from a base station.

To achieve at least the above objects and advantages in whole or parts, the present invention provides in accordance with one embodiment an automatic frequency controlling apparatus of a mobile communication terminal which receives a pilot signal radiated from a base station for a specific time period. The apparatus includes a complex correlator for detecting the pilot signal; an automatic frequency controller for detecting a peak position value from the pilot signal and calculating a digital AFC (Automatic Frequency Control) voltage using a difference value (dev) between a value between successive peak position values and a defined period; and an oscillator for outputting an oscillation frequency to a demodulator according to an analog-converted AFC voltage.

In accordance with another embodiment, the present invention provides an automatic frequency controlling apparatus of a mobile communication terminal which includes a peak detector for detecting a peak position from a pilot signal transmitted from a base station; a peak period deviation detector for calculating a difference value (dev) between a value between successive peak position values and a defined period; a zero counter for counting the number of successive '0' in the difference value (dev) and outputting a zero-run value; an AFC mapping unit for calculating a digital AFC voltage using the difference value (dev) and the zero-run value; and an oscillator for outputting an oscillation frequency without an analog-converted AFC voltage through a D/A converter.

In accordance with another embodiment, the present invention provides an automatic frequency controlling method of a mobile communication terminal which includes detecting a peak position of a pilot signal transmitted from a base station; calculating an AFC voltage with a variation amount of interval between successive peak position values; and controlling a frequency of an input signal by outputting an oscillation frequency according to the AFC voltage.

In accordance with another embodiment, the present invention provides an automatic frequency controlling method of a mobile communication terminal which includes detecting a pilot signal transmitted from a base station; detecting a peak position value of the pilot signal; subtracting a previous peak position value and a defined period value from the peak position value to calculate a difference value (dev); calculating a zero-run value by counting the number of successive '0' in the difference value (dev); performing a certain calculation on the difference value (dev) and the zero-run value to calculate a digital AFC voltage; and analog-converting the digital AFC voltage and applying it to an oscillator.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
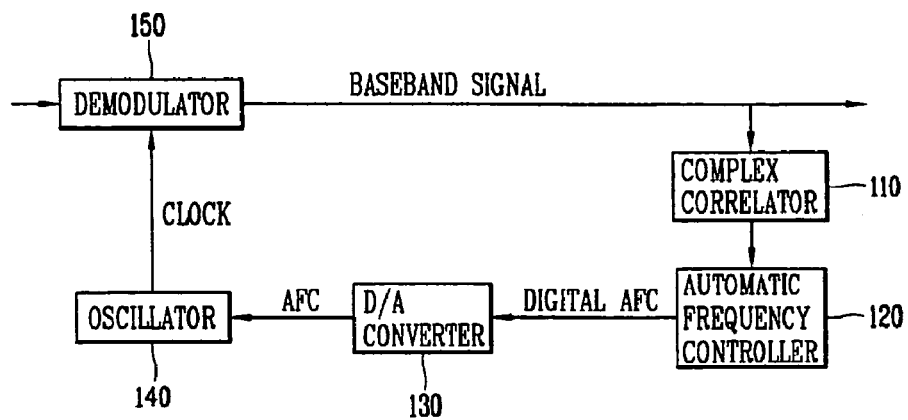
FIG. 1 is a diagram showing an automatic frequency controlling apparatus of a mobile communication terminal in accordance with a preferred embodiment of the present invention.

FIG. 1 is a diagram showing an automatic frequency control apparatus for a mobile communication terminal in accordance with a preferred embodiment of the present invention. This apparatus includes a complex correlator 110, an automatic frequency controller 120, a D/A converter 130, an oscillator 140, and a demodulator 150. The complex converter detects a pilot signal transmitted from a base station (not shown). The automatic frequency controller calculates a difference value between a peak position value of the pilot signal and a previous peak position value, and then outputs a digital AFC (Automatic Frequency Control) voltage based on the difference. The D/A (Digital/Analog) converter converts the digital AFC voltage into an analog value for controlling the oscillator frequency. And, the demodulator demodulates a signal transmitted from the base station based on an oscillation clock of the oscillator 140. The complex correlator 110 and the automatic frequency controller 120 are preferably included in a digital baseband modem.

The pilot signal allows for recognition of a base station of a cell where a mobile communication terminal is positioned and serves as a reference for temporal alignment when a signal is outputted. The AFC voltage controls a frequency of the oscillator 140 minutely.

Figure 2:
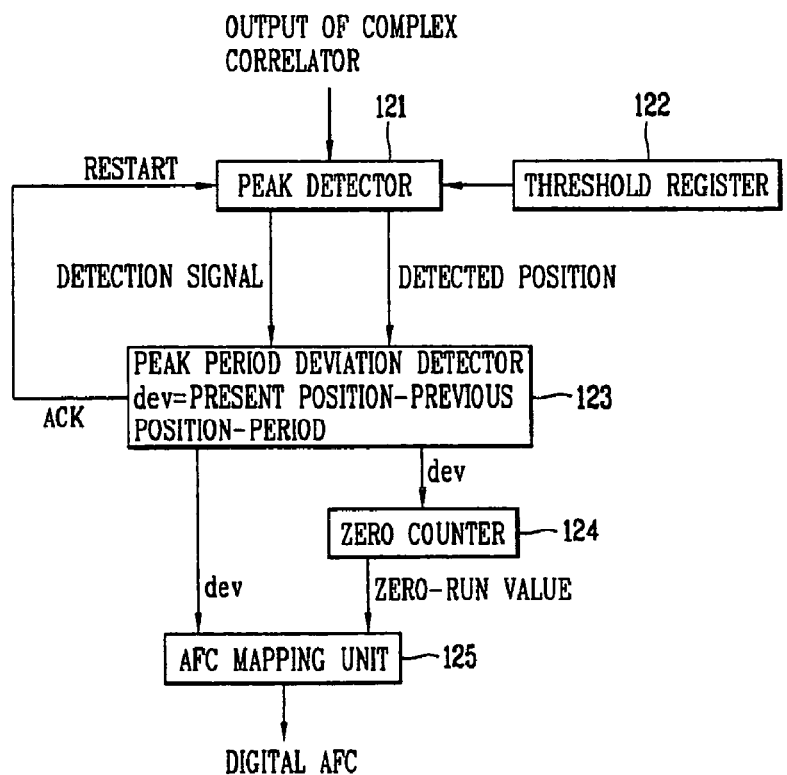
FIG. 2 is a diagram showing an automatic frequency controller included in FIG. 1.

FIG. 2 is a diagram showing the automatic frequency controller of FIG. 1. The controller includes a peak detector 121, a threshold register 122, a peak period deviation detector 123, a zero counter 124, and an AFC mapping unit 125. The peak detector detects a peak position by comparing the pilot signal detected by the complex correlator with a value of a threshold register. The peak period deviation detector subtracts a previously detected peak position value and a period value from a currently detected peak position value to output a difference value (dev). The zero counter counts the number of 0s until a value other than 0 is input from the difference value (dev), and outputs a zero-run value. The AFC mapping unit converts the difference value (dev) and the zero-run value into the digital AFC voltage.

The peak period deviation detector 123 includes an accumulator (not shown) which stores the difference value (dev), and after the accumulator operates the peak period deviation detector 123 transmits an acknowledgment ACK signal so that the peak detector can detect the next peak position.

The digital AFC voltage output from the AFC mapping unit may be expressed, for example, by Equation (1):

$$AFC(n)=AFC(n-1)+delta\_AFC \quad (1)$$

An initial value AFC (0) may be determined by an intermediate value of a displacement or through calibration of a receiver of a corresponding mobile communication terminal. Delta_AFC changes according to standards of oscillator 140 and D/A converter 130. Delta_AFC may be obtained by mapping the difference value (dev) to a specific value, and then dividing the mapped value by a variable using the zero-run value The automatic frequency control apparatus in accordance with the present invention can be implemented in a mobile communication system in which a base station radiates a pilot signal for a specific time period. This system may be, for example, a TDD (Time Division Duplexing) system, however other types of systems are possible.

In operation, the complex correlator 110 detects a pilot signal from among a plurality of signals transmitted through a wireless network from a base station. The pilot signal is input into the automatic frequency controller 120. The pilot signal may be a signal the base station of the TDD system downwardly radiates. Because the pilot signal has excellent auto-correlation characteristics, it can be detected even if a communications environment is not good.

Figure 3:
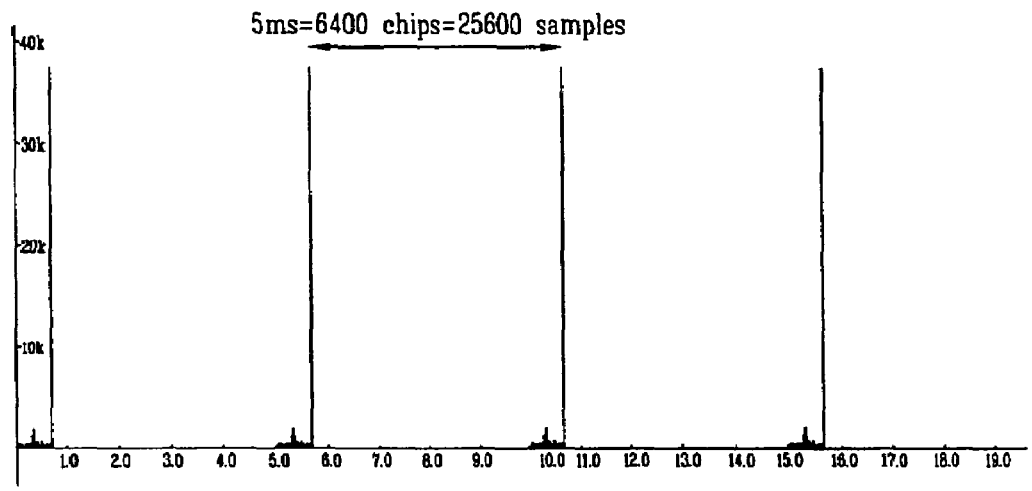
FIG. 3 is a graph showing waveforms of a complex correlator.

FIG. 3 is a graph showing illustrative output waveforms that may be obtained when the complex correlator normally operates in the TDD communication environment. In this graph, a signal component at a position where the pilot signal exists is remarkably discriminated with respect to signal components of other sections.

The digital baseband modem including the complex correlator and the automatic frequency controller can recognize a start position of a sub-frame on the basis of a position of the pilot signal and identify a time slot.

The interval between peaks maybe the one defined in the 3GPP technical specification TS 25.221: "Physical channels and mapping of transport channels onto physical channels (TDD)," the contents of which is incorporated by reference herein. This interval is 6400 chips. The interval between peaks becomes 6400×n samples in an 'n' oversample environment. In FIG. 3, an output signal is 4 oversamples, so the peak interval is 25600 samples. In this respect, the interval between peaks differs slightly depending on an environment of a receiving side.

At this time, the automatic frequency controller receives an output signal of complex correlator 110, detects a difference value between a peak position value of a currently detected pilot signal and a previously detected peak position value, and outputs a digital AFC voltage. D/A converter 130 converts the digital AFC voltage into an analog voltage and applies it to oscillator 140. Then, the oscillator controls an oscillation frequency according to the AFC voltage.

Operation of the automatic frequency controller 120 will now be described in detail. Peak detector 121 detects a peak position that is greater than a voltage of the threshold register 122 and that is a maximum value during a certain interval. The peak detector then transfers a detect signal and the detected position to the peak period deviation detector 123. The detect signal indicates that a peak of the pilot signal has been detected, and the detected position is a peak position value of the pilot signal made by the sample unit, not the chip unit.

Peak period deviation detector 123 stores a difference value obtained by subtracting the previously detected peak position value and the period value from the currently detected peak position value in the accumulator (not shown).

Each peak interval of an ideal pilot signal is expected to correspond to the period value. If the difference value is positive, the oscillation frequency of the mobile communication terminal may be considered to be fast. If the difference value is negative, the oscillation frequency of the mobile communication terminal may be considered to be slow.

After the accumulator (not shown) operates, peak period deviation detector 123 outputs an ACK signal to peak detector 121 so that the peak detector can detect the next peak. In general, when a frequency is within an operation range, the difference value (dev) may be outputted in the following form:

0, 0, 0, 1, 0, 0, 0, 1, 0, 0, 0, 0, 1, 0, 0, −1, 0,−1, 0, 0, 1, 0, 0, 0, 0, 0, 2, 0, 0, 1 . . .

Zero counter 124 counts the number of 0s until a value other than 0 comes in the difference value (dev), and outputs a zero-run value.

AFC mapping unit 125 converts the output value (dev) of peak period deviation detector 123 and an input signal indicated as the output value (zero-run value) of zero counter 124 into a delta_AFC. At this time, the signal inputted to AFC mapping unit 125 is (1,3),(1,3),(1,5),(−1,2),(−1,1),(−1,2),(2,5),(1,2) . . .

Conversion of the input signal into the delta_AFC can be implemented by several methods according to characteristics of the oscillator 140 and the standards of the D/A converter 130.

Table 1, Equation (1), and Equation (2) shown below may be used, for example, to implement the delta_AFC conversion method. Table 1 shows difference values mapped to specific values and Equation (2) may be used to calculate the delta_AFC.

TABLE 1

| Dev | Delta_AFC$_{period}$(dev) |
|---|---|
| ≧4 | −550 |
| 3 | −500 |
| 2 | −400 |
| 1 | −245 |
| −1 | 245 |
| −2 | 400 |
| −3 | 500 |
| ≧−4 | 550 |

$$\text{delta\_AFC} = \frac{\text{delta\_AFC}_{period}(\text{dev}_n)}{2^{zero-run_n}} (zero - run_n \leq 4) \quad (2)$$

$$\text{delta\_AFC} = \frac{\text{delta\_AFC}_{period}(\text{dev}_n)}{4 \times zero - run_n} (zero - run_n \leq 4) \quad (3)$$

A digital AFC voltage finally obtained by substituting the delta_AFC to Equation (1) is inputted to the D/A converter.

Figure 4:
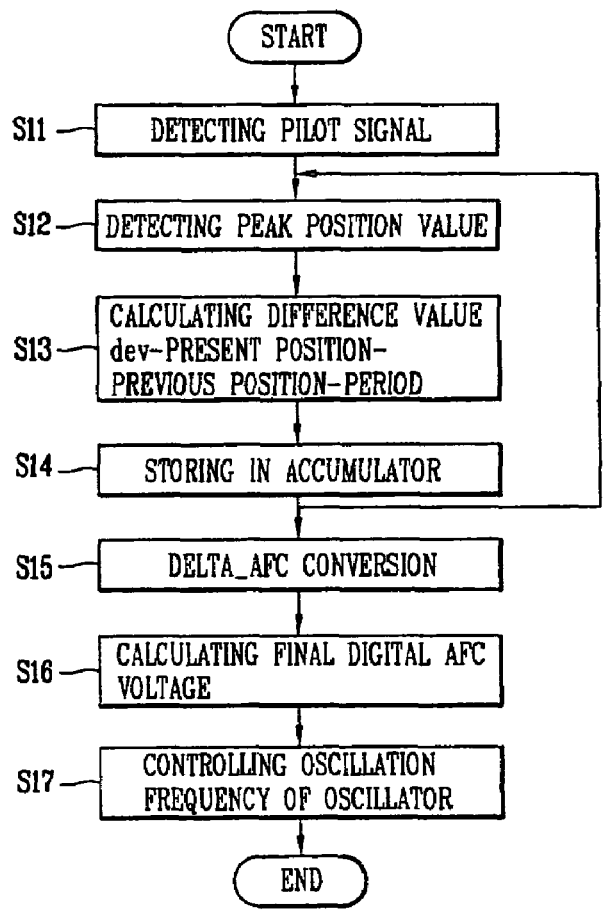
FIG. 4 is a flow chart showing steps included in an automatic frequency controlling method of a mobile communication terminal in accordance with the preferred embodiment of the present invention.

FIG. 4 is a flow chart showing steps included in an automatic frequency controlling method in accordance with a preferred embodiment of the present invention. Initially, a pilot signal is detected from a signal input to the mobile communication terminal (step S11). A peak position value at which a frequency is the maximum during a certain interval is then searched from the pilot signal (step S12).

A previously detected peak position value and a period value between peaks are subtracted from the peak position value to calculate a difference value (dev) (step S13). If the difference value (dev) is not '0', the value is stored in the accumulator (step S14). After the accumulator operates, an ACK signal is transmitted to the peak detector so that the peak detector can detect the next peak.

Since the period value is a defined value, if the difference value (dev) is positive, a frequency of the oscillator is considered to be fast. If the difference value (dev) is negative, the frequency of the oscillator is considered to be slow. If the difference value (dev) is 0, an ideal oscillation frequency is considered to exist.

A zero-run value is obtained by counting the number of 0s that come successively in the difference value (dev) (step S14). Then, the difference value and the zero-run value are converted into a delta-AFC (step S15). At this time, the conversion relation differs depending on the standards of the oscillator and the D/A converter.

The delta-AFC is added to the previously detected digital AFC voltage to obtain a current digital AFC voltage (step S16). The digital AFC voltage is applied to the oscillator through the D/A converter to control the oscillation frequency of the oscillator (step S17).

As so far described, the automatic frequency controlling apparatus and method of a mobile communication terminal of the present invention have at least the following advantages. A downlink pilot signal radiated from a base station of the TDD system during a specific time period is detected to control an oscillation frequency. The oscillation frequency can be accurately generated without being substantially affected by noise in the communications environment, and thus communication performance can be enhanced.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A mobile terminal, comprising:
   a complex correlator which detects a control signal from a base station;
   an automatic frequency controller which detects a current peak position value from the control signal and calculates an AFC (Automatic Frequency Control) voltage based on a difference value (dev) between the current peak position value and a previous peak position value; and
   an oscillator which generates an oscillation frequency for controlling a demodulator based on the AFC voltage, wherein the automatic frequency controller comprises:
   a peak detector which detects the current peak position value from the control signal;
   a peak period deviation detector which subtracts the previous peak position value from the current peak position value to calculate the difference value (dev);
   a zero counter which counts a number of successive 0s in the difference value (dev) and outputs a zero-run value; and
   an AFC mapping unit which converts the difference value (dev) and the zero-run value into digital AFC voltages.

2. The mobile terminal of claim 1, wherein the control signal is a pilot signal.

3. A mobile terminal, comprising:
   a complex correlator which detects a control signal from a base station;
   an automatic frequency controller which detects a current peak position value from the control signal and calculates an AFC (Automatic Frequency ControP) voltage based on a difference value (dev) between the current peak position value and a previous peak position value; and
   an oscillator which generates an oscillation frequency for controlling a demodulator based on the AFC voltages, wherein the AFC voltage is a digital value expressed by:

$AFC(n)=AFC(n-1)+\text{delta\_}AFC.$

4. The apparatus of claim 3, wherein the delta_AFC is obtained by:
   mapping the difference value (dev) to a specific real number value; and
   dividing the mapped value by a variable using a zero-run value.

5. An automatic frequency controlling apparatus for a mobile communication terminal, comprising:

a peak detector which detects a current peak position value from a control signal transmitted from a base station;

a peak period deviation detector which calculates a difference value (dev) between a value between the current peak position value and a previous peak position values;

a zero counter which counts a number of successive 0s in the difference value (dev) and output a zero-run value;

an AFC mapping unit which calculates an AEC voltage based on the difference value (dev) and the zero-run value; and an oscillator which generates an oscillation frequency based on the AFC voltage.

6. The apparatus of claim 5, wherein the current peak position value corresponds to a peak value in the control signal which has a value greater than a voltage of a threshold register during a prescribed interval.

7. The apparatus of claim 5, wherein the difference value (dev) is obtained by subtracting the previous peak position value from the current peak position value.

8. The apparatus of claim 5, wherein the AFC voltage is a digital value expressed by:

$$AFC(n)=AFC(n-1)+delta\_AFC.$$

9. The apparatus of claim 8, wherein the delta_AFC is obtained by:

mapping the difference value (dev) to a specific real number value; and dividing the mapped value by a variable using a zero-run value.

10. The apparatus of claim 9, wherein if the difference value is positive, the delta_AFC is obtained as a negative number, and wherein if the difference value is negative, the delta_AFC is obtained as a positive number.

11. An automatic frequency controlling method of a mobile communication terminal, comprising:

detecting a current peak position value of a control signal transmitted from a base station;

calculating an AFC voltage indicative of an amount of variation betxveen the current peak position value and previous peak position value; and controlling a frequency of an input signal to be transmitted based on the AFC voltage, wherein said calculating comprises:

calculating a difference value by subtracting the previous position value and a from the current peak position value;

calculating a zero-run value by counting a number of successive 0s in the difference value (dev); and generating AFC voltage based on the difference value and the zero-run value.

12. The method of claim 11, wherein the detecting comprises: detecting the control signal; and detecting a peak position value from the control signal.

13. The method of claim 11, wherein the step of calculating the difference value (dev) comprises:

transmitting an acknowledgement ACK signal to a peak detector so as to find the next peak position.

14. The method of claim 11, wherein the AFC voltage is calculated by:

$$AFC(n)=AFC(n-1)+delta\_AFC.$$

15. The method of claim 14, wherein the delta_AFC is obtained by:

mapping the difference value (dev) to a specific real number value; and dividing the mapped value by a variable using a zero-run value.

16. The method of claim 11, wherein the control signal is a pilot signal.

* * * * *